United States Patent [19]

Zato

[11] Patent Number: 4,523,295
[45] Date of Patent: Jun. 11, 1985

[54] POWER LOSS COMPENSATION FOR PROGRAMMABLE MEMORY CONTROL SYSTEM

[75] Inventor: Thomas J. Zato, Palatine, Ill.

[73] Assignee: Zenith Electronics Corporation, Glenview, Ill.

[21] Appl. No.: 415,309

[22] Filed: Sep. 7, 1982

[51] Int. Cl.³ .............................................. G06F 1/00
[52] U.S. Cl. .................................. 364/900; 358/190;
358/335; 364/483; 340/660; 340/661; 340/662;
340/663
[58] Field of Search ... 364/200 MS File, 900 MS File,
364/483; 358/190, 335; 455/231, 171, 181;
360/33.1; 340/660, 661, 662, 663, 693, 798, 799

[56] References Cited

U.S. PATENT DOCUMENTS

| | | | |
|---|---|---|---|
| 3,959,778 | 5/1976 | Brette | 364/200 |
| 3,959,783 | 5/1976 | Fressineau | 364/200 |
| 4,162,513 | 7/1979 | Beyers et al. | 455/181 |
| 4,277,827 | 7/1981 | Carlson et al. | 364/200 |
| 4,306,299 | 12/1981 | Check et al. | 364/900 |

*Primary Examiner*—James D. Thomas
*Assistant Examiner*—David Y. Eng

[57] ABSTRACT

An arrangement for storing user programmed system timing information in a microprogrammable system in the event of a power outage. The system includes a static random access memory (RAM) for periodically storing microprocessor-generated timing information and an electrically erasable programmable ROM (EEPROM) which is coupled to the static RAM for the temporary storage of this information in the event of a power outage. Also provided in the system is a power down sensor responsive to an AC-coupled power supply for detecting power loss to the system. When the input voltage drops below a predetermined value, the contents of the static RAM are automatically transferred to the nonvolatile EEPROM. When system input power is restored, the stored contents of the nonvolatile EEPROM are automatically retransferred back to the static RAM for use by the microprocessor permitting the resumption of system operation as previously programmed on a time-shifted basis where the time shift equals the duration of the power outage. The system is particularly adapted for use with a user-programmed device, such as a television receiver or a video cassette recorder, in an environment where power outages of very short duration randomly occur. The present invention permits such a system to resume programmed system operation following resumption of power to the system without employing the combination of a battery, an oscillator, a CMOS RAM and appropriate recharging circuitry, as generally utilized in such systems.

10 Claims, 3 Drawing Figures

POWER LOSS COMPENSATION FOR PROGRAMMABLE MEMORY CONTROL SYSTEM

BACKGROUND OF THE INVENTION

This invention generally relates to programmable systems having memory means for storing control information and more specifically is directed to an improved system for protecting against the temporary loss of power in a programmable control system wherein system timing information is not lost, but is retained for later use when power is resumed permitting a return to normal system operation.

Programmable memories are increasingly being utilized for the timed control of a device by means of user initiated inputs. The applications in which such memories are utilized vary from industrial control systems to viewer control of a home video display device such as a television receiver or a video cassette recorder. The typical random access memory (RAM) is a volatile memory wherein the contents thereof are lost when the power applied thereto is interrupted.

In order to make these programmable systems operable in an environment where power interruptions may occur, even for very short durations, a nonvolatile memory is generally incorporated in combination with a RAM. Typically the user initiated control inputs are first stored in the RAM and then transferred to the nonvolatile memory for subsequent recall. These nonvolatile memories may take several forms. For example, a metal-nitride-oxide-semiconductor (MNOS) memory may be utilized as the nonvolatile memory device. However, these MNOS memories are not only expensive, but suffer from various operating limitations. One limitation in this type of memory device relates to the degradation of data retention therein with the number of erase/write cycles. In other words, the typical MNOS memory wears out with continued use. In addition, MNOS devices have relatively slow write times on the order of 100 milliseconds and currently have multiple power supply requirements.

Another type of memory device frequently used to compensate for power outages is a complementary-metal-oxide-semiconductor (CMOS) memory element. These CMOS nonvolatile memories are utilized in combination with a battery, an oscillator, and conventional recharging circuitry. Thus, during periods of power outage the battery powers the memory cell while timing information is provided thereto by the oscillator. The incorporation of these additional components not only increases system cost, but also results in system operating limitations. For example, batteries not only contain corrosive components which may leak, but also are subject to failure (in one to seven years), are highly temperature sensitive, and require mechanical design provisions allowing for access for replacement.

The present invention is intended to overcome the aforementioned limitations by providing a system for storing program timing information and real time data in a nonvolatile memory in response to the sensing of an imminent power outage condition. The system provides for the high speed storage of the program timing information and real time data in a nonvolatile memory for the duration of power outage, its recall therefrom upon resumption of power and the providing of such information to a microprocessor in exercising system control in accordance with previously programmed instructions.

OBJECTS OF THE INVENTION

Accordingly, it is an object of the present invention to provide an improved system for the temporary storage of data during and its recall following a power outage.

It is another object of the present invention to provide an improved user programmable control system particularly adapted for operation in a system subject to random power outages of short duration.

Still another object of the present invention is to provide a programmable nonvolatile memory system responsive to user inputs not subject to the operating limitations of systems using CMOS and present MNOS nonvolatile memories.

A further object of the present invention is to provide a programmable control system having a nonvolatile memory particularly adapted for controlling home entertainment devices such as a television receiver or a video cassette recorder in an environment subject to short duration power outages.

BRIEF DESCRIPTION OF THE DRAWINGS

The appended claims set forth those novel features believed characteristic of the invention. However, the invention itself as well as further objects and advantages thereof will best be understood by reference to the following detailed description of a preferred embodiment taken in conjunction with the accompanying drawings, where like reference characters identify like elements throughout the various figures, in which:

DESCRIPTION OF THE PREFERRED EMBODIMENT

Figure 1:
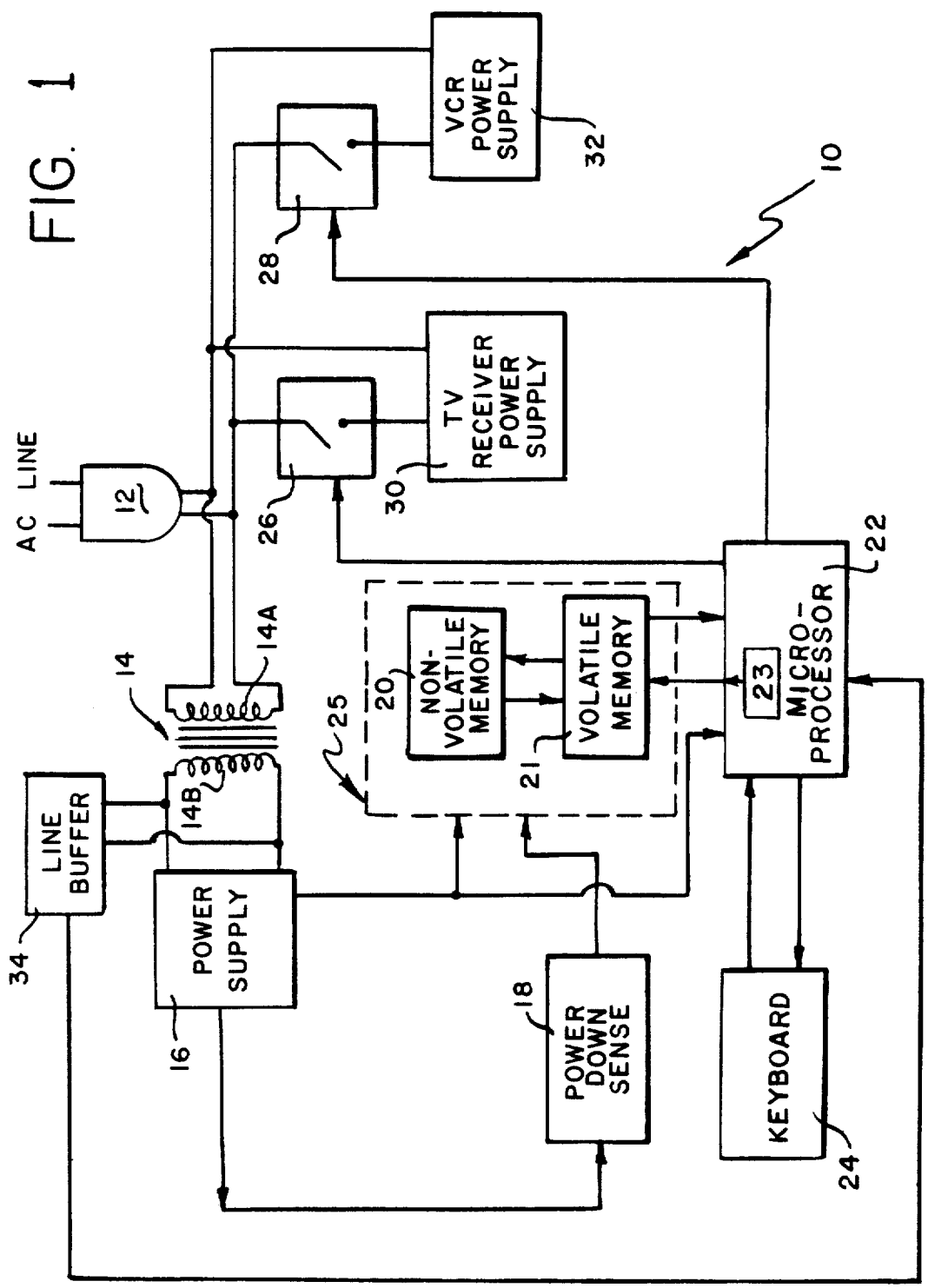
FIG. 1 is a combination simplified block diagram and schematic diagram of a programmable memory control system having power outage protection in accordance with the present invention.

Referring to FIG. 1, there is shown partially in simplified block diagram form and partially in schematic diagram form a power loss compensation arrangement for a programmable memory control system 10 in accordance with the present invention. An AC line source is provided to the present invention by means of a plug 12. This AC power is then provided by means of first and second power relays 26, 28 to a television receiver power supply and a video cassette recorder (VCR) power supply 30, 32, respectively. With AC input power thus provided to the television receiver and the VCR, these devices are selectively controlled by providing programming information thereto in a manner to be described.

Also coupled to the AC line via plug 12 is the primary winding 14A of a transformer 14. The secondary winding 14B of transformer 14 steps the 115 volt AC source down to a lower voltage which is provided to and energizes a DC power supply 16.

DC power supply 16 may be conventional in design, typically including a rectifying bridge and voltage regulation circuitry (not shown), and is capable of providing a plurality of DC output voltages at various levels as required. Power supply 16 provides regulated DC outputs to microprocessor 22 and to power down sense circuitry 18. Microprocessor 22 may be substantially conventional in design, with the MN1442 microprocessor manufactured by Matsushita Electronics Corporation utilized in a preferred embodiment. This signal processor is an N-channel, 4-bit, single chip microprocessor with an arithmetic logic unit, a ROM, I/O ports, a counter/timer, a clock generator and a shift register. Microprocessor 22 includes a read only memory (ROM), not shown in FIG. 1, in which is stored a time-based operating program which processes user-initiated inputs in the form of program timing information in terms of real time data for generating output control signals. Also provided is a line buffer 34 coupled to the secondary winding 14B of transformer 14 and to microprocessor 22 for providing 60 Hz timing information thereto. Line buffer 34 steps down the voltage of the signal in secondary winding 14B and provides a real time reference signal at the proper voltage to microprocessor 22 which generates timing signals in response thereto for proper system operation.

User entries are made by means of a keyboard 24 which is continually scanned by microprocessor 22 for the detection of entries thereon. Since a preferred embodiment of the present invention is designed for programming a television receiver and/or a VCR, such entries as turn-on time, turn-off time, and desired channel number may be entered by means of keyboard 24. Microprocessor 22 receives this control information in the form of program timing instructions from keyboard 24 and writes this information into the volatile memory 21 of a memory integrated circuit (IC) 25 for temporary storage therein. The memory IC 25 also includes a nonvolatile memory 20 described below. Volatile memory 21 is a conventional random access memory (RAM) capable of temporarily storing for later recall the aforementioned program timing instructions. After these instructions are stored in volatile memory 21 by means of microprocessor 22, real time information as provided by the microprocessor's clock generator 23 is used to read the previously entered program timing instructions from the volatile memory 21 and to selectively provide these control inputs to first and second power relays 26, 28 for the selective energization of the television receiver and/or VCR power supplies 30, 32 in accordance with the previously entered user initiated keyboard control inputs.

Also providing an input to the memory IC 25 is a power down sense circuit 18 which is coupled to the DC power supply 16 and responsive to an output voltage therefrom. Power down sense circuit 18 detects a DC voltage output by power supply 16, compares this voltage level with a reference voltage, and provides output signals to the memory IC 25 in response to this comparison. If power supply 16 outputs several signals at various voltage levels, the output signal having the fastest decaying voltage at power down should be provided to the power down sense circuit 18 as a reduction in power supply output voltage would generally first appear in this signal. The manner in which the output voltage from power supply 16 is compared to a reference voltage may be conventional in design in the power down sense circuit 18.

Figure 3:
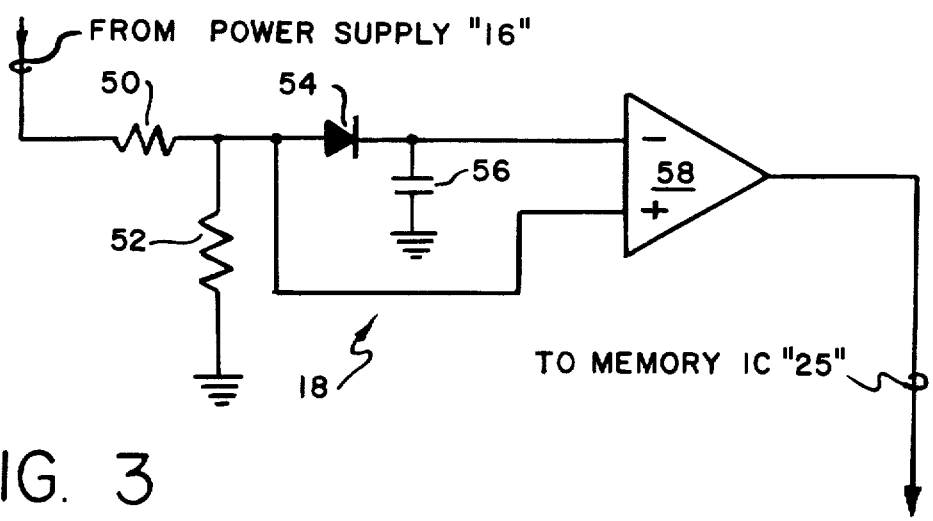
FIG. 3 is a schematic diagram of a power down sense circuit for detection of the loss of input power for use in the present invention.

For example, a power down sense circuit which could be utilized in the present invention is shown in FIG. 3. A high voltage output from the power supply 16 is divided-down by means of the resistive network comprised of resistors 50, 52 and provided to the noninverting input of a differential amplifier 58 and to capacitor 56 for the charging thereof. The output of discharging capacitor 56 is provided only to the inverting input of differential amplifier 58 due to the presence of the blocking diode 54. The inherent time constant in the capacitive storage element connected to the inverting input to differential amplifier 58 results in this input representing the output of power supply 16 at a previous time defined by the aforementioned time constant. The power supply output provided directly via resistors 50, 52 to the noninverting input of differential amplifier 58 represents the present output of power supply 16. Thus, the present output voltage level of the power supply 16 is compared with its previous output voltage level with an output being provided by the differential amplifier 58 to the memory IC 25 when the present output drops below the previous output of the power supply 16 by a predetermined voltage value as measured by differential amplifier 58. Power down sense circuit 18 thus provides an indication to the memory IC 25 of an impending loss of power in the programmable memory control system 10. When a discharging capacitor is used to provide the reference voltage, as in the arrangement just described, it is essential that the discharge rate of the capacitor be less than the rate of decay of the output of power supply 16 during a power outage.

An output signal representing an impending loss of power is provided from the power down sense circuit 18 to the memory IC 25 causing the contents of the volatile memory 21 to be read therefrom and written into the nonvolatile memory 20. Because the volatile memory 21 must be energized during this memory storage transfer operation, the predetermined voltage level to which the output of the power supply 16 is compared in the power down sense circuit 18 must be of such magnitude as to permit subsequent operation of the volatile memory 21 as the power supply output is further reduced to zero in the case of a total loss of power. In a preferred embodiment of the present invention, power is applied to the volatile memory 21 for approximately 20 milliseconds following detection of a reduction in the power supply output to allow the transfer of control information from the volatile memory 21 to the nonvolatile memory 20. Thus, once power down is sensed, a first output signal is provided by the power down sense circuit 18 to the volatile memory 21 resulting in a dumping of the contents thereof into the nonvolatile memory 20. The information thus transferred from the volatile memory 21 to the nonvolatile memory 20 represents user programmable timing information as entered via keyboard 24 by a user, processed in microprocessor 22 and temporarily stored in volatile memory 21, in addition to real time information as processed by microprocessor 22.

When power is restored, a second control signal is generated by the power down sense circuit 18 in response to the comparison of the power supply output and the reference voltage and this second control signal is also provided to the memory IC 25. In response to the second control signal, the volatile memory 21 executes a read routine wherein the contents of nonvolatile memory 20 are read therefrom and loaded into the volatile memory 21. In response to the re-energization of power supply 16, microprocessor 22 reads the contents again stored in volatile memory 21 therefrom, processes these stored control signals in accordance with the program stored in its ROM (not shown), and provides appropriate commands to the first and second power relays 26, 28 in energizing respective television and VCR power supplies 30, 32. In response to the re-establishment of the power supply voltage, the microprocessor 22, which receives and is responsive to the power supply's output, is placed in a reset condition for the execution of an initialization routine. This initialization routine results in the reading of information from the volatile memory 21 and loading the information thus read from the volatile memory 21 into appropriate RAM locations in microprocessor 22. These operations are standard procedures generally used in most conventional microprocessor controlled systems. The information thus read from volatile memory 21 and stored in microprocessor 22 is then used by the microprocessor's ROM program to determine the appropriate time to activate the power relay for operation of the selected device coupled thereto as previously programmed by the user.

Figure 2:
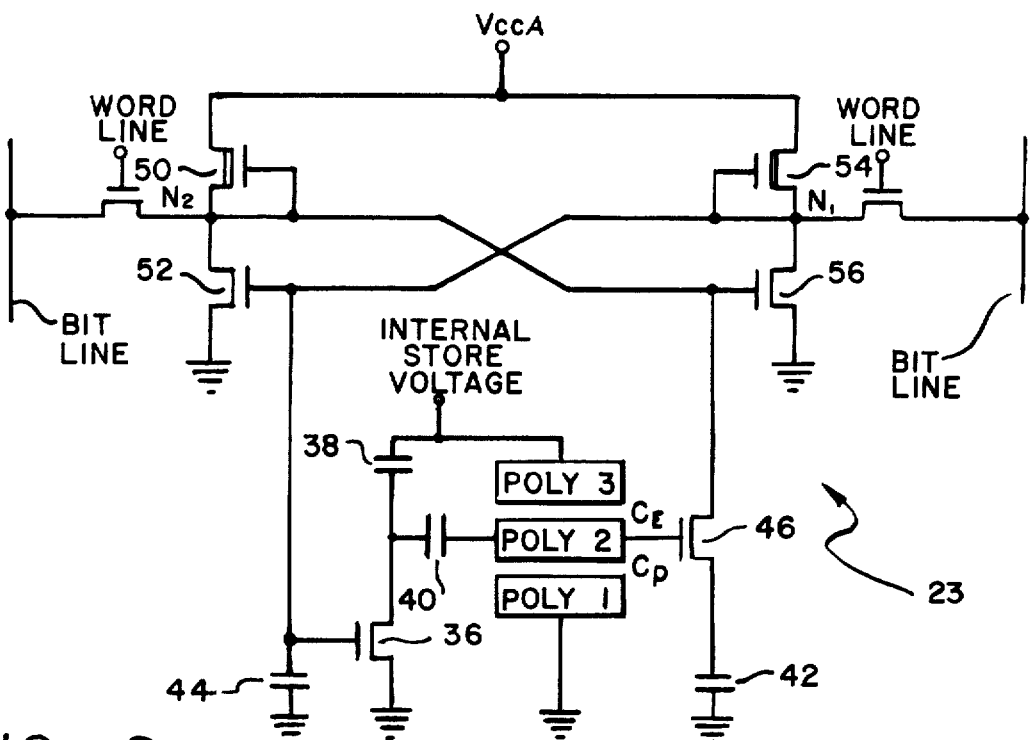
FIG. 2 shows the circuit of the nonvolatile memory cell utilized in a preferred embodiment of the present invention.

Volatile memory 21 is a static RAM, while nonvolatile memory 20 is an electrically erasable programmable read only memory (EEPROM). In a preferred embodiment of the present invention, nonvolatile and volatile memories 20, 21 are included in the memory IC 25 as shown in FIG. 2. This type of device is commercially available from XICOR Inc., of Milpitas, Calif., as the NOVRAM memory device. Nonvolatile data is stored during periods when power is not provided to the memory IC 25 by the absence or presence of charges on floating polysilicon gates POLY 1, 2 and 3. Charge can be injected or removed from a floating gate by applying electric fields of sufficient strength to cause electron tunneling through oxides surrounding each polysilicon gate. At normal field strengths the charges are permanently trapped on the floating gate even when power is removed. Three layers of polysilicon are utilized with the second layer acting as the floating gate. The floating gate (POLY 2) is connected to the rest of the circuit only through capacitance. Electrons are moved to the floating gate by tunneling from POLY 1 to POLY 2 and removed by tunneling from POLY 2 to POLY 3.

Charge transfer is controlled by the capacitance ratios in the memory IC 25. If node N1 is low, insulated gate type field effect transistor (MOSFET) 36 is turned OFF. This allows the junction between capacitors 38, 40 to float. Since the combined capacitance of capacitors 38, 40 is larger than the capacitance between POLY 1 and POLY 2, $C_p$, the floating gate follows the Internal Store Voltage node. When the voltage on the floating gate is high enough, electrons are tunneled from POLY 1 to POLY 2 and the floating gate is negatively charged. This is what occurs in the Store operation when data is read from volatile memory 21 and stored in nonvolatile memory 20 and in initiated when the voltage at the Internal Store Voltage node goes high in response to a high, first control signal provided to volatile memory 21 from the power down sense circuit 18. Referring back to FIG. 1, the Internal Store Voltage is the control signal provided from the power down sense circuit 18 to the memory IC 25.

If node N1 is HIGH, transistor 36 is turned ON which grounds the junction between capacitors 38, 40. Since capacitor 40 is larger than the capacitance between POLY 2 and POLY 3, $C_E$, capacitor 40 holds the floating gate near ground when the Internal Store Voltage node is pulled HIGH. This creates a sufficient field between POLY 2 and POLY 3 to tunnel electrons away from the floating gate (POLY 2) leaving it with a positive charge.

The Recall, or read, operation also takes advantage of capacitance ratios. The value of capacitor 42 is larger than that of capacitor 44. When the External Recall command is received from the power down sense circuit 18 as the second control signal output therefrom, the memory IC's internal power supply, $V_{CCA}$, is first pulled LOW to equalize the voltage on nodes N1 and N2. When the Internal Power node is allowed to rise, the node which has the light loading will rise more rapidly and the gain of the flip-flop comprised of transistors 50, 52, 54 and 56 will cause it to latch HIGH and the opposite node to latch LOW. If the floating gate has a positive charge, capacitor 42 is connected to node N2 through transistor 46 and node N2 will latch LOW. If the floating gate has a negative charge, transistor 46 is turned OFF and N1 will have the heavier loading. This will occur when the second control signal to the volatile memory is low and will result in the transfer of data from the nonvolatile memory 20 to the volatile memory 21. By thus controlling the capacitance ratios between the various polysilicon gates, data is transferred either from the static RAM volatile memory 21 to the EEPROM nonvolatile memory 20, or vice versa. The transfer of data occurs in a single operation with the entire contents of a memory device including timing and control instructions transferred therein. Following this transfer, the contents of both memories are identical.

There has thus been shown a means for compensating for power loss in a programmable memory control system. Upon detection of a reduction in power supply voltage, the contents of a volatile static RAM are automatically transferred to a nonvolatile EEPROM. With the resumption of power, this information is then read from the EEPROM into the static RAM and provided to a microprocessor for controlling the programmable device, or devices, as desired. Such information as system timing and control inputs may thus be recalled following a power outage and system operation continued with the power outage evidenced as only a brief time shift in the operating program equal in duration to the period of power outage.

While particular embodiments of the present invention have been shown and described, it will be apparent to those skilled in the art that changes and modifications may be made therein without departing from the invention in its broader aspects. The aim in the appended claims, therefore, is to cover all such changes and modifications as fall within the true spirit and scope of the invention.

I claim:

1. In an arrangement for controlling a programmable device energized by an AC source, said arrangement including a DC power supply coupled to said AC source for generating a DC output voltage, clock means coupled to said AC source for generating real time data, programming means responsive to user-initiated inputs for generating program time data, a controller energized by said DC power supply and coupled to said programmable device, to said programming means for receiving said program time data therefrom and to said clock means for receiving said real time data therefrom, and wherein is stored a time-based control program for controlling said programmable device in accordance with said program time data referenced to said real time data, and a volatile memory coupled to said controller for temporarily storing said program and real time data during the execution of said time-based control program, a power loss protection system comprising:

power sense means coupled to said volatile memory and to said DC power supply, said power sense means comprising means for developing first control signal and capacitive means for developing second control signals respectively representing the present and a previous output voltage of said DC power supply and comparison means for comparing said first and second control signals for generating and providing to said volatile memory a write instruction when said first control signal drops below said second control signal and a read instruction when said first control signal rises above said second control signal; and a nonvolatile memory coupled to said volatile memory for receiving and storing said program and real time data when said volatile memory receives a write instruction and for transferring said program and real time data to said volatile memory when said volatile memory receives a read instruction for later recall by said controller in resuming control of said programmable device in accordance with said time-based control program following an interruption in the output of said DC power supply, wherein the operation of said programmable device is shifted in time by an interval equal to the duration of the interruption of said power supply.

2. The system of claim 1 wherein said volatile memory and said nonvolatile memory are respectively comprised of a static random access memory and an electrically erasable programmable read only memory with said program and real time data transferred therebetween upon the occurrence of an interruption in the output of said DC power supply.

3. The system of claim 1 wherein said programmable device includes the combination of a television receiver and a video cassette recorder with said controller including a microprocessor coupled to said television receiver and said video cassette recorder for controlling the operation thereof in accordance with said time-based control program.

4. The system of claim 3 further including first and second switch relay means respectively coupling said AC source to said television receiver and said video cassette recorder and wherein said first and second switch relay means are further coupled to said microprocessor for selectively operating said television receiver and said video casasette recorder in accordance with said time-based control program.

5. The system of claim 1 wherein said power sense means comprises said capacitive means charged by the output voltage of said DC power supply for storing a charge representative thereof and said comparison means includes differential amplifier means for comparing the present output voltage of said DC power supply with a previous output voltage therefrom as represented by the discharge of said capacitor means to said differential amplifier means.

6. The system of claim 5 wherein the rate of discharge of said capacitor means is slower than the rate of decay of the output voltage of said DC power supply following a power interruption.

7. The system of claim 1 wherein said real time data is provided to said controller periodically when said controller is energized by said DC power supply and wherein the most recent user-entered program time data and the real time data at the time of the start of said power outage is recalled from said nonvolatile memory when power is restored following a power outage.

8. The system of claim 1 wherein said DC output voltage includes a high voltage signal and a low voltage signal with said high voltage signal provided to said power sense means and said low voltage signal provided to said controller.

9. The system of claim 1 wherein said clock means provides a real time data signal to said controller having a frequency equal to that of said AC source.

10. A system for controlling a video display device in response to user initiated control signals applied thereto, wherein user control of said video display device is not lost due to a power outage but is automatically restored following the resumption of power without the need for a standby power source, said system comprising:

a source of DC input power energized by an AC source;

input means responsive to user inputs for generating first control signals;

control means energized by said DC input power source and wherein is stored a time-based control program, said control means coupled to said input means for generating program time data in response to said first control signals and coupled to said AC source for generating real time data;

volatile memory means coupled to said control means for temporarily storing said program and real time data for subsequent recall by said control means in generating second control signals in accordance with said time-based control program;

signal level detection means comprising capacitive means for storing a charge representative of the output voltage of said DC input power source and comparison means for comparing a voltage representative of the present output voltage of said DC input power source and the charge stored by said capacitive means for providing write or read instructions to said volatile memory when the present output voltage of said DC input power source drops below or rises above, respectively, the charge stored by said capacitive means; and nonvolatile memory means coupled to said volatile memory means for temporarily storing said program and real time data when the present output of said DC input source drops below the charge stored by said capacitive means and for restoring said program and real time data to said volatile memory means when the present output of said DC input source subsequently rises above the charge stored by said capacitive means.

* * * * *